(12) United States Patent
Kim

(10) Patent No.: US 7,674,659 B2
(45) Date of Patent: Mar. 9, 2010

(54) METHOD FOR FABRICATING A THIN FILM TRANSISTOR

(75) Inventor: Hoon Kim, Seoul (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 133 days.

(21) Appl. No.: 11/798,476

(22) Filed: May 14, 2007

(65) Prior Publication Data

US 2007/0218602 A1 Sep. 20, 2007

Related U.S. Application Data

(62) Division of application No. 10/798,574, filed on Mar. 12, 2004, now Pat. No. 7,238,965.

(30) Foreign Application Priority Data

Apr. 17, 2003 (KR) ................................ 2003-24431

(51) Int. Cl.
*H01L 21/00* (2006.01)
(52) U.S. Cl. .............................. 438/151; 257/E21.413; 257/72
(58) Field of Classification Search ................. 438/151; 257/E21.413, 72, 66
See application file for complete search history.

(56) References Cited

U.S. PATENT DOCUMENTS

| | | | |
|---|---|---|---|
| 4,035,198 A | 7/1977 | Dennard et al. |
| 4,287,661 A | 9/1981 | Stoffel |
| 4,715,930 A | 12/1987 | Diem |
| 4,949,141 A | 8/1990 | Busta |
| 5,144,401 A | 9/1992 | Ogura et al. |
| 5,173,753 A | 12/1992 | Wu |
| 5,196,717 A | 3/1993 | Hiroki et al. |
| 5,492,843 A | 2/1996 | Adachi |
| 5,510,640 A | 4/1996 | Shindo |
| 5,985,704 A | 11/1999 | Adachi et al. |
| 6,033,941 A | 3/2000 | Yang |
| 6,396,079 B1 | 5/2002 | Hayashi et al. |
| 6,509,234 B1 | 1/2003 | Krivokapic |

(Continued)

FOREIGN PATENT DOCUMENTS

JP 61-078138 4/1986

(Continued)

OTHER PUBLICATIONS

*The Office Action* from the Japanese Patent Office issued in Applicant's corresponding Japanese Patent Application No. 2004-109072 dated Oct. 30, 2007.

(Continued)

*Primary Examiner*—W. David Coleman
*Assistant Examiner*—Sonya D McCall-Shepard
(74) *Attorney, Agent, or Firm*—Robert E. Bushnell, Esq.

(57) ABSTRACT

The present invention relates to a thin film transistor for preventing short of circuit by step and a method for fabricating the thin film transistor and provides a thin film transistor including a buffer layer formed on glass substrate; an activation layer formed on the buffer layer; and a gate insulation layer formed on the buffer layer including the activation layer, with the buffer layer having a step formed between a lower part of the activation layer and a part except the lower part of the activation layer.

14 Claims, 2 Drawing Sheets

U.S. PATENT DOCUMENTS

| | | | |
|---|---|---|---|
| 6,528,855 | B2 | 3/2003 | Ye et al. |
| 6,534,788 | B1 | 3/2003 | Yeo et al. |
| 6,746,904 | B2 | 6/2004 | Van der Zaag et al. |
| 6,777,747 | B2 | 8/2004 | Yedinak et al. |
| 7,238,965 | B2 * | 7/2007 | Kim .......................... 257/72 |
| 2002/0054247 | A1 | 5/2002 | Hwang et al. |
| 2003/0122178 | A1 | 7/2003 | Yang |
| 2004/0005740 | A1 | 1/2004 | Lochtefeld et al. |
| 2004/0084722 | A1 | 5/2004 | Yamaguchi et al. |
| 2004/0173812 | A1 | 9/2004 | Currie et al. |
| 2004/0211356 | A1 | 10/2004 | Yamazaki et al. |

FOREIGN PATENT DOCUMENTS

| | | |
|---|---|---|
| JP | 63-093150 | 4/1988 |
| JP | 01-128575 | 5/1989 |
| JP | 02-031464 | 2/1990 |
| JP | 02-281634 | 11/1990 |
| JP | 04-096337 | 3/1992 |
| JP | 04-101432 | 4/1992 |
| JP | 06-224392 | 8/1994 |
| JP | 08-125195 | 5/1996 |
| JP | 08-153699 | 6/1996 |
| JP | 2001-125135 | 5/2001 |
| JP | 2001-320062 | 11/2001 |
| JP | 2002-033330 | 1/2002 |
| JP | 2002-111002 | 4/2002 |
| JP | 2002-329860 | 11/2002 |
| JP | 2004-153112 | 5/2004 |
| KR | 010082828 | 8/2001 |
| KR | 100332124 | 3/2002 |

OTHER PUBLICATIONS

*Academic Press Dictionary of Science and Technology* (1992).
*New Penguin Dictionary of Science and Technology* (1998).
*Penguin English Dictionary* (2000).
*Kagan & Andry (ed.) Thin Film Transistors, Marcel Dekker*, New York, 2003 pp. 158 and 169-178.
Office action from the Japanese Patent Office issued in Applicant's corresponding Japanese Patent Application No. 2004-109072 dated Mar. 10, 2009.

* cited by examiner

METHOD FOR FABRICATING A THIN FILM TRANSISTOR

CROSS-REFERENCE TO RELATED APPLICATIONS

This application is a Divisional of Applicant's patent application Ser. No. 10/798,574 filed in the U.S. Patent & Trademark Office on the 12$^{th}$ of Mar. 2004, now U.S. Pat. No. 7,238,965 and assigned to the assignee of the present invention. All benefits accruing under 35 U.S.C. §120 from the parent application are also hereby claimed.

CLAIM OF PRIORITY

This application makes reference to, incorporates the same herein, and claims all benefits accruing under 35 U.S.C. §119 from an application for THIN FILM TRANSISTOR AND METHOD OF FABRICATING THE SAME earlier filed in the Korean Intellectual Property Office on 17 Apr. 2003 and there duly assigned Serial No. 2003-24431.

BACKGROUND OF THE INVENTION

1. Field of the Invention

The present invention relates to a thin film transistor and a method for fabricating the same, more particularly, to a thin film transistor for preventing short of circuit due to step and a method for fabricating the same.

2. Description of Related Art

Recently, thickness of gate insulation layer of a thin film transistor is gradually reduced. However, frequency of short generation between activation layer and gate electrode is increased as thickness of the gate insulation layer on the side wall of the activation layer is being reduced due to a high step generated as buffer layer in the lower part of the activation layer is etched at the same when the activation layer is formed.

The earlier art is described in detail as follows.

A polysilicon layer is formed by crystallizing an amorphous silicon layer deposited on a glass substrate equipped with buffer layer. Then, an activation layer is formed by patterning the polysilicon layer, and surface treatment process is performed using HF, etc., to remove impurities on the surface of the activation layer.

Next, a gate insulation layer is deposited on the substrate, and a gate electrode is formed on the gate insulation layer.

A step A1 is formed on the buffer layer accordingly since the buffer layer is over-etched in patterning process for forming the activation layer and surface treatment process for treating the surface of the activation layer.

It can be seen that thickness of the gate insulation layer on the side wall of the activation layer is reduced by the high step A1 formed by over-etching of the buffer layer. That is, it can be seen that thickness of the gate insulation layer on the side wall of the activation layer is reduced from B1 to B2. Therefore, a short can be generated between the activation layer and gate electrode as thickness of the gate insulation layer is reduced.

There is a method for forming the gate insulation layer thickly in order to solve the foregoing problems. However, there are problems in that driving voltage is increased, and power consumption is increased if the gate insulation layer is deposited thickly.

SUMMARY OF THE INVENTION

Therefore, in order to solve the foregoing problems of the earlier art, it is an object of the present invention to provide a thin film transistor capable of preventing short of circuit by controlling step formed during formation of activation layer and preventing deterioration of efficiency or generation of display defects by decreasing thickness of gate insulation layer and a method for fabricating the thin film transistor.

It is another object to provide a thin film transistor in which a short is not generated between the activation layer and gate electrode by forming gate insulation layer to an even thickness on the side wall of the activation layer in case that the step is formed in a height corresponding to a half or less of the thickness sum of the activation layer and gate insulation layer.

It is yet another object of the present invention to provide a thin film transistor capable of forming gate insulation layer more thinly and controlling thickness of activation layer also in advance by controlling the step.

It is still another object of the present invention to provide a thin film transistor that is easy and inexpensive to manufacture and yet more reliable.

It is another object to provide a thin film transistor capable of preventing a short of a circuit while not increasing driving voltage and power consumption.

In order to achieve the foregoing and other objects, the present invention provides a thin film transistor including a buffer layer formed on glass substrate; an activation layer formed on the buffer layer; and a gate insulation layer formed on the buffer layer including the activation layer, wherein the buffer layer has a step formed between a lower part of the activation layer and a part except the lower part of the activation layer, and the step is a half or less of the thickness sum of the activation layer and gate insulation layer.

It is preferable that the buffer layer has a step to such a degree that thickness of the gate insulation layer is not changed on the side wall of the buffer layer. Furthermore, it is preferable that thickness of the gate insulation layer is 400 Å (Angstroms) or more in case that thickness of SPC polysilicon is 300 Å and step is 350 Å in the activation layer, and thickness of the gate insulation layer is 1,000 Å or more in case that thickness of ELA polysilicon is 500 Å and step is 750 Å in the activation layer.

Furthermore, the present invention provides a method for fabricating a thin film transistor including the steps of depositing an amorphous silicon layer on glass substrate equipped with buffer layer; forming a polycrystalline silicon layer by crystallizing the amorphous silicon layer; forming an activation layer by etching the polycrystalline silicon layer; treating the surface of the activation layer; and depositing a gate insulation layer on the substrate, wherein etching time is controlled in the activation layer forming process and activation layer surface treatment process so that step between a lower part of gate in the buffer layer and a part except the lower part of the gate has a step value corresponding to a half or less of the thickness sum of the activation layer and gate insulation layer.

In preferred embodiments of the present invention, it is preferable that the etching time is controlled so that the buffer layer has a step to such a degree that thickness of the gate insulation layer is not changed on the side wall of the buffer layer, and the buffer layer has a step corresponding to a half or less of the thickness sum of the activation layer and gate insulation layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
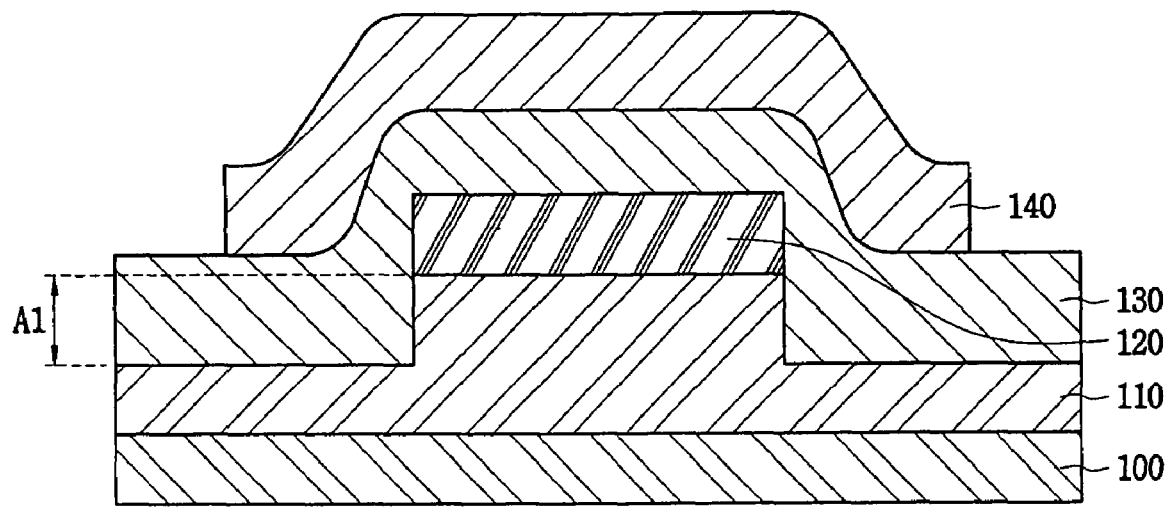
FIG. 1 is a cross sectional view illustrating a conventional thin film transistor.
Figure 2:
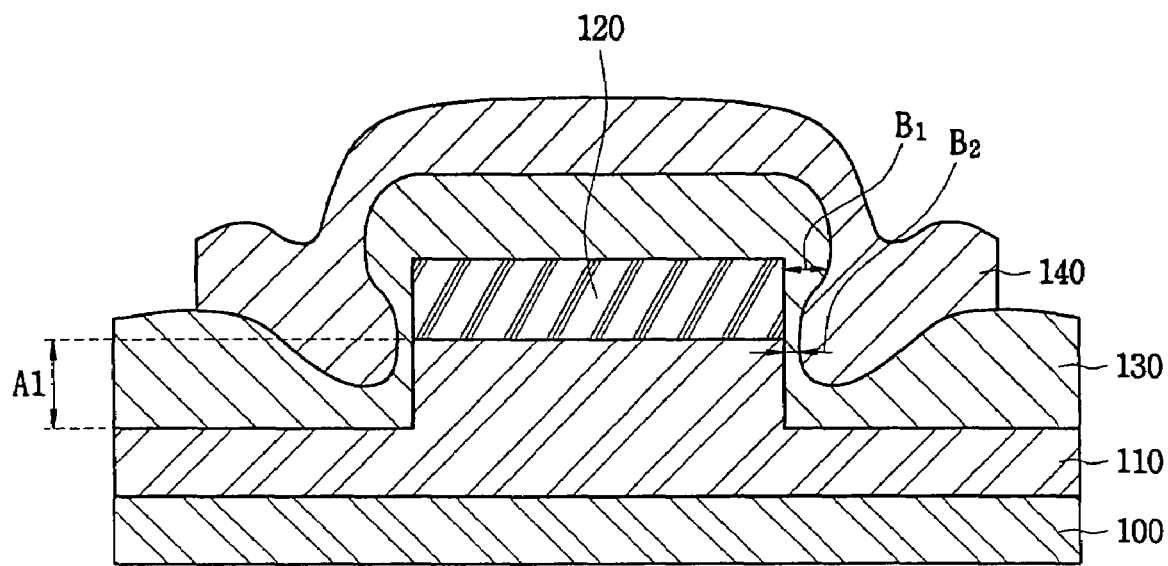
FIG. 2 is a SEM photograph showing that short is generated at the side surface of activation layer by over-etching in the conventional thin film transistor.

Turning now to the drawings, FIG. 1 is a cross sectional view illustrating a conventional thin film transistor and FIG. 2 is a SEM photograph showing that a short is generated at the side surface of activation layer by over-etching in the conventional thin film transistor.

Referring to FIG. 1, a polysilicon layer is formed by crystallizing an amorphous silicon layer deposited on a glass substrate 100 equipped with buffer layer 110. Then, an activation layer 120 is formed by patterning the polysilicon layer, and surface treatment process is performed using HF, etc., to remove impurities on the surface of the activation layer 120.

Next, a gate insulation layer 130 is deposited on the substrate, and a gate electrode 140 is formed on the gate insulation layer.

A step A1 is formed on the buffer layer 110 accordingly since the buffer layer 110 is over-etched in patterning process for forming the activation layer 120 and surface treatment process for treating the surface of the activation layer 120.

Referring to FIG. 2, it can be seen that thickness of the gate insulation layer 130 on the side wall of the activation layer 120 is reduced by the high step A1 formed by over-etching of the buffer layer 110. That is, it can be seen that thickness of the gate insulation layer on the side wall of the activation layer is reduced from B1 to B2 as illustrated in FIG. 2. Therefore, a short can be generated between the activation layer 120 and gate electrode 140 as thickness of the gate insulation layer 130 is reduced.

There is a method for forming the gate insulation layer 130 thickly in order to solve the foregoing problems. However, there are problems in that driving voltage is increased, and power consumption is increased if the gate insulation layer 130 is deposited thickly.

The present invention will now be described in detail in connection with preferred embodiments with reference to the accompanying drawings. For reference, like reference characters designate corresponding parts throughout several views.

Figure 3:
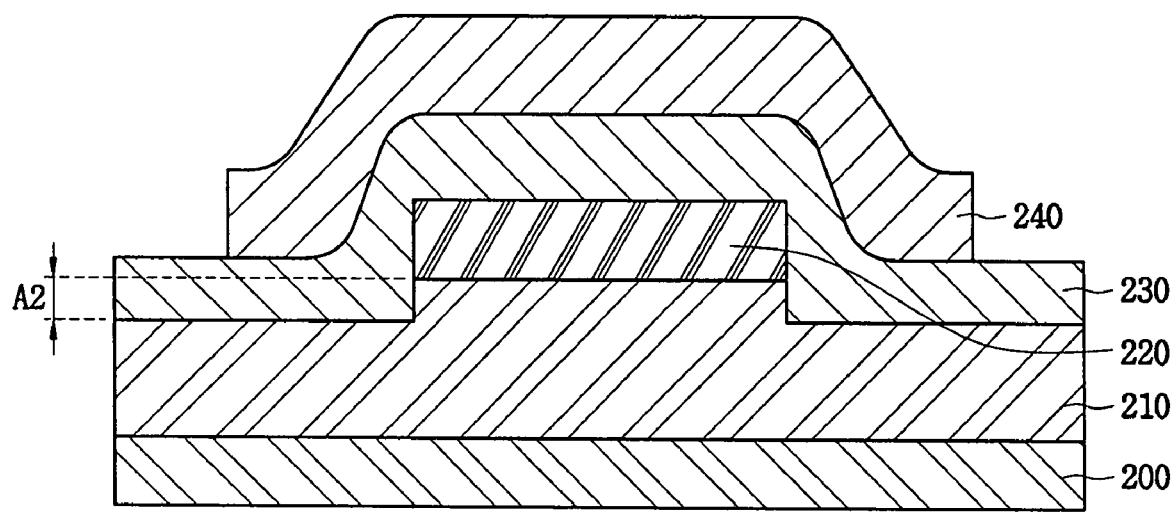
FIG. 3 is a thin film transistor according to one preferred embodiment of the present invention.

FIG. 3 is a thin film transistor according to one preferred embodiment of the present invention. As seen in FIGS. 1-3, each one of the steps A1 and A2 is a distance until a top of the buffer layer overstretched from top of the activation layer. In addition, the degree of the step is the height of the step.

Referring to FIG. 3, a buffer layer 210 (diffusion barrier) is formed on a glass substrate 200 to prevent impurities such as metal ions diffused from the glass substrate 200 from infiltrating into the activation layer of polycrystalline silicon.

An amorphous silicon layer is deposited on an upper part of the buffer layer 210 after forming the buffer layer 210. The dehydrogenated amorphous silicon layer is formed into polycrystalline silicon layer (polysilicon layer) through crystallization method such as ELA (excimer laser annealing), etc., after dehydrogenating the amorphous silicon layer. Then, photoresist for forming an activation layer is formed on the polysilicon layer, and the activation layer 220 that functions as channel region of TFT (thin film transistor) is formed by patterning the polysilicon layer using the photoresist as a mask.

Next, the surface of the activation layer 220 is treated by a material such as HF to remove impurities including photoresist remaining on the surface of the activation layer 220 after the process of forming the activation layer 220.

A step A2 is formed on the buffer layer 210 due to over-etching of the buffer layer 210 during the activation layer forming process and activation layer surface treatment process. However, the step A2 is controlled in the present invention so that gate insulation layer is deposited to an even thickness on the side wall of the activation layer when subsequently depositing the gate insulation layer by controlling over-etching time of the buffer layer 210 during the activation layer forming process and activation layer surface treatment process.

The following Table 1 is a table showing a relation between thickness of the gate insulation layer 230 and step A2 caused by over-etching.

TABLE 1

| Relation between thickness of the gate insulation layer and over-etching | | | | |
|---|---|---|---|---|
| Over etching | Thickness of Si | The maximum over etching value = (gate insulation layer + polysilicon thickness)/2 | Destruction of TR | Gate insulation layer |
| 500 Å | ELA 500 Å | 750 Å | Action | Silicon oxide layer (1000 Å) |
| 700 Å | ELA 500 Å | 750 Å | Destruction initiation | |
| 1000 Å | ELA 500 Å | 750 Å | Destruction | |
| 200 Å | SPC 300 Å | 350 Å | Action | Silicon oxide layer (400 Å) |
| 400 Å | SPC 300 Å | 350 Å | Destruction initiation | |

Referring to Table 1, it can be seen that a thin film transistor is destructed if step A2 having a height of 700 Å or more is formed by over-etching of buffer layer in case that thickness of ELA polysilicon layer used as activation layer 220 is 500 Å, and thickness of silicon oxide film that is gate insulation layer 230 is 1000 Å.

Furthermore, it can be also seen that the thin film transistor is destructed if step A2 having a height of 400 Å or more is formed by over-etching of buffer layer in case that thickness of SPC (solid phase crystallization) polysilicon layer that is an activation layer is 300 Å, and thickness of silicon oxide film that is gate insulation layer 230 is 400 Å.

That is, the thin film transistor is destructed if the step A2 formed by over-etching of the buffer layer has a height corresponding to a half or more of the thickness sum of the gate insulation layer 230 and polysilicon layer as seen in the table 1 representing a relation between thickness of the gate insulation layer 230 and over-etching.

Therefore, it is preferable that step A2 of the buffer layer is formed in a height corresponding to a half or less of the thickness sum of the gate insulation layer 230 and polysilicon layer.

Subsequently, gate insulation layer 230 is formed on substrate equipped with the activation layer 220, a conductive gate metal is deposited on the upper part of the gate insulation layer 230, and gate electrode 240 is formed by patterning the gate metal.

The present invention provides a thin film transistor in which a short circuit is not generated between the activation layer and gate electrode by forming gate insulation layer to an even thickness on the side wall of the activation layer in case that the step is formed in a height corresponding to a half or less of the thickness sum of the activation layer and gate insulation layer as illustrated in the above.

Furthermore, the present invention provides a thin film transistor capable of forming gate insulation layer more thinly and controlling thickness of activation layer also in advance by controlling the step.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for fabricating a thin film transistor comprising:
   providing the thin film transistor that includes a substrate, a buffer layer, an activation layer formed on said buffer layer, and a gate insulation layer formed on said buffer layer and said activation layer, with said buffer layer having a step formed between a lower part of said activation layer and a part except said lower part of said activation layer, and said step being up to a half of the thickness sum of said activation layer and gate insulation layer;
   forming a polycrystalline silicon layer;
   forming the activation layer by etching said polycrystalline silicon layer;
   treating a surface of said activation layer; and
   depositing the gate insulation layer on said substrate, with etching time being controlled in the activation layer forming process and the activation layer surface treatment process to accommodate the step between a lower part of a gate in said buffer layer and a part except the lower part of said gate having a step value corresponding up to a half of the thickness sum of said activation layer and gate insulation layer.

2. The method for fabricating a thin film transistor according to claim 1, wherein the etching time is controlled to accommodate said buffer layer including the step to such a degree where said gate insulation layer is deposited to an even thickness on a side wall of said activation layer.

3. The method for fabricating a thin film transistor according to claim 1, wherein the etching time is controlled to accommodate said buffer layer having a step corresponding up to half of the thickness sum of the activation layer and gate insulation layer.

4. The method for fabricating a thin film transistor according to claim 1, wherein a thickness of said gate insulation layer is at least 400 Å when the thickness of solid-phase crystallization polysilicon is 300 Å and the step is 350 Å in the activation layer or the thickness of said gate insulation layer is at least 1,000 Å when the thickness of excimer laser annealing polysilicon is 500 Å and the step is 750 Å in said activation layer.

5. A method of fabricating a thin film transistor, comprising:
   depositing an amorphous silicon layer on a substrate equipped with a buffer layer;
   forming a polycrystalline silicon layer by crystallizing said amorphous silicon layer;
   forming an activation layer by etching said polycrystalline silicon layer;
   treating a surface of said activation layer; and
   depositing a gate insulation layer on said substrate, wherein a step between a lower part of gate in the buffer layer and a part except the lower part of said gate has a step value corresponding to a half or less of the thickness sum of said activation layer and gate insulation layer by controlling an etching time in said activation layer forming process and said activation layer surface treatment process.

6. The method of claim 5, wherein said buffer layer has a step to such a degree that a thickness of said gate insulation layer is not changed on said side wall of said buffer layer by controlling the etching time.

7. The method of claim 5, wherein said buffer layer having a step corresponding to a half or less of the thickness sum of the activation layer and gate insulation layer is accommodated by controlling said etching time.

8. The method of claim 5, wherein a thickness of said gate insulation layer is 400 Å or more upon thickness of SPC polysilicon is 300 Å and the step is 350 Å in said activation layer.

9. The method of claim 5, wherein thickness of said gate insulation layer is 1,000 Å or more upon the thickness of ELA polysilicon is 500 Å and the step is 750 Å in said activation layer.

10. The method of claim 7, wherein said buffer layer has a step to such a degree that thickness of said gate insulation layer is not changed on said side wall of said buffer layer by controlling said etching time.

11. A method of fabricating a thin film transistor, comprising:
   providing a substrate;
   forming a polycrystalline silicon layer;
   forming an activation layer by etching said polycrystalline silicon layer;
   treating a surface of said activation layer; and
   depositing a gate insulation layer on said substrate, wherein a step between a lower part of a gate in said buffer layer and a part except the lower part of said gate having a step value corresponding up to a half of the thickness sum of said activation layer and gate insulation layer by controlling an etching time in the activation layer forming process and activation layer surface treatment process.

12. The method of claim 11, wherein said buffer layer including the step is accommodated to such a degree where said gate insulation layer is deposited to an even thickness on a side wall of said activation layer by controlling the etching time.

13. The method of claim 11, said buffer layer having a step corresponding up to half of the thickness sum of the activation layer and gate insulation layer is accommodated by controlling the etching time.

14. The method of claim 11, wherein a thickness of said gate insulation layer is at least 400 Å upon the thickness of SPC polysilicon is 300 Å and the step is 350 Å in the activation layer or the thickness of said gate insulation layer is at least 1,000 Å upon the thickness of ELA polysilicon is 500 Å and the step is 750 Å in said activation layer.

* * * * *